United States Patent
Hsiao et al.

(10) Patent No.: US 7,049,839 B1
(45) Date of Patent: May 23, 2006

(54) METHOD AND RELATED APPARATUS FOR CHIP TESTING

(75) Inventors: Chin-Fa Hsiao, Taipei Hsien (TW); Chin-Yi Chiang, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 0 days.

(21) Appl. No.: 11/160,591

(22) Filed: Jun. 30, 2005

(30) Foreign Application Priority Data

Apr. 1, 2005 (TW) .............................. 94110455 A

(51) Int. Cl.
*G01R 31/02* (2006.01)

(52) U.S. Cl. ..................................................... 324/755

(58) Field of Classification Search ................ 324/765, 324/763, 158.1; 714/700, 745

See application file for complete search history.

(56) References Cited

U.S. PATENT DOCUMENTS

| | | | | |
|---|---|---|---|---|
| 5,254,940 A | * | 10/1993 | Oke et al. | 714/733 |
| 5,371,457 A | * | 12/1994 | Lipp | 324/158.1 |
| 5,534,774 A | * | 7/1996 | Moore et al. | 324/158.1 |
| 6,356,096 B1 | * | 3/2002 | Takagi et al. | 324/765 |

\* cited by examiner

*Primary Examiner*—Jermele Hollington
*Assistant Examiner*—Tung X. Nguyen
(74) *Attorney, Agent, or Firm*—Winston Hsu

(57) ABSTRACT

A chip capable of performing self testing includes: an output circuit for generating output signals; a transmitting circuit coupled to the output circuit for transmitting output signals generated by the output circuit; a receiving circuit for receiving signals transmitted to the chip and generating corresponding receiving signals; a first multiplexer; and an input circuit coupled to an output port of the first multiplexer for receiving outputs of the first multiplexer, wherein the first multiplexer includes: a first input port coupled to the output circuit for receiving output signals generated by the output circuit; and a second input port coupled to the receiving circuit for receiving signals generated by the receiving circuit.

15 Claims, 5 Drawing Sheets

METHOD AND RELATED APPARATUS FOR CHIP TESTING

BACKGROUND OF THE INVENTION

1. Field of the Invention

The present invention relates to a method and related apparatus for chip testing, and more particularly, a method and related apparatus for chip testing capable of differentiating whether or not each analogue front-end of a digital/analogue circuit inside a chip functions as normal.

2. Description of the Prior Art

An electronic circuit is an extremely important hardware foundation in our modernized information society; as semiconductor information industry develops, electronic circuits of different functions have been integrated into a single chip, resulting in the single chip having many complicated functions.

In order for the chip to operate normally, it is necessary to carry out a test on the manufactured chip. However, in present chip test technology, emphasis is placed on the overall function of the chip. In the most basic test, the chip is tested for corresponding reactions under predetermined conditions according to specification and function based on the chip design—for example, how the chip should respond and what signals are transmitted after the chip receives or executes a specific signal/instruction. An actual test is then applied to the chip in receiving or executing this kind of signal/instruction, and the chip is checked as to whether the response sent out conforms to the standard required. This is in order to understand whether the operation of the chip conforms to the specification and the function of the original design.

Although the above mentioned prior art is capable of determining whether the overall function of the finished product (chip) is functioning normally, when the chip is not functioning normally, this test technology is unable to determine which part of the chip is not operating. As mentioned previously, the modern chip has many kinds of complicated integrated electronic circuits, therefore if the abnormal part in the chip cannot be clearly located, tests engineers will have difficulty in determining the reason for the fault. For example, most modern chips have digital input/output circuits and analogue transmission/receiving circuits; after the chip performs a digital processing operation, signals to be sent out will be converted into a predetermined format via the output circuit, and then activated and transmitted by the transmission circuit. The signal to be transmitted to the chip is first sensed by a receiving circuit, and inverse-converted by the input circuit to form digital signals that can be read/processed by the chip. When testing the chip, if signals sent out by the chip do not conform to a response which the chip should have, there is a possibility that digital input/output circuits are not functioning normally, or there is a possibility that the function of an analogue transmission/receiving circuit is abnormal. The prior art can only observe and compare the whole output of the chip, and the exact location of the malfunction circuit cannot be distinguished, this also causes the chip manufacturers difficulties in effectively improving chip design or production technology.

SUMMARY OF THE INVENTION

It is therefore one of the primary objectives of the claimed invention to provide a better chip testing technology to overcome the disadvantages of the conventional technology so that chip manufacturers can better understand whether different circuits functioning inside a chip are normal, and abnormal parts in the chip can be quickly located for improvement.

In brief, the claimed invention has a built-in inner loop-back in the chip so that during chip testing certain circuits can be selectively bypassed/isolated in the chip to directly test functions of other circuits in order to detect whether these circuits are abnormal or not. For example, as mentioned previously, the analog front end (AFE) of the chip is formed by digital output/input circuits and analog transmission/receiving circuits; if technology of the present invention requires implementing the AFE, a controllable inner loop-back can be installed in between the digital output/input circuit, such as a multiplexer capable of switching output signals of the output circuit to transmit to the transmission circuit or to directly transmit to the input circuit via the inner loop-back. When testing the chip, the inner loop-back is first closed to enable the chip to send out signals via the output circuit to the transmission circuit. After receiving the signals sent out by the chip, if the signals do not conform to requirements, there is a possibility that either the output circuit or the transmission circuit is not functioning normally. In order to further confirm the abnormal part, the present invention can connect to the inner loop-back where the signals of the chip will be directly transmitted to the input circuit via the output circuit. Another situation is that the signals of the chip sent out are normal but there is an error in the signals received. In this situation, the technology of the present invention is also capable of distinguishing whether there is a problem with the receiving circuit. Likewise, as the inner loop-back test enables the signal to bypass the transmission circuit (without passing through the transmission circuit), the operational situation of the output circuit can be tested. If the output circuit operation is functioning normally, then the abnormal part is the transmission circuit through cross-comparison in the chip.

In another embodiment of the claimed invention, the technology of the claimed invention utilizes a chipset, such as an AFE under a serial advanced technology attachment (SATA) specification in the chipset to test an interface of the SATA in the chipset. As known to those skilled in the art, the chipset in the computer system can realize an interface of different specifications through a single chip, such as interface specification of a peripheral communication interconnect (PCI), an intelligent drive electronic (IDE), and so on, connecting peripherals of each type of interface specification (such as attachment card, hard disk and storage devices) so that these devices can exchange information/signals via the chipset and a central processor unit and memory in the computer system. Among them, the SATA interface belongs to a high-speed interface which requires a high data transmission path to send and receive data, therefore input/output of the AFE requires a better and more precise electric circuit to eliminate error, and to test the technology to ensure its operation is functioning normally. The technology of the claimed invention can apply an interface circuit of the SATA to eliminate error and to test each circuit component and related circuit of the AFE of the interface circuit.

When a chip test is performed on the chipset, the claimed invention can also output the operational condition of different components of the chip respectively through the input output pad (IO pad) of other interface specifications in the chipset. For example, when testing the interface of the SATA, a single output of individual operational situation of another internal component is transmitted out of the chip through the IO pad of the IDE to further clarify whether individual circuit operation conforms to requirements, which is also helpful in locating an abnormal component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
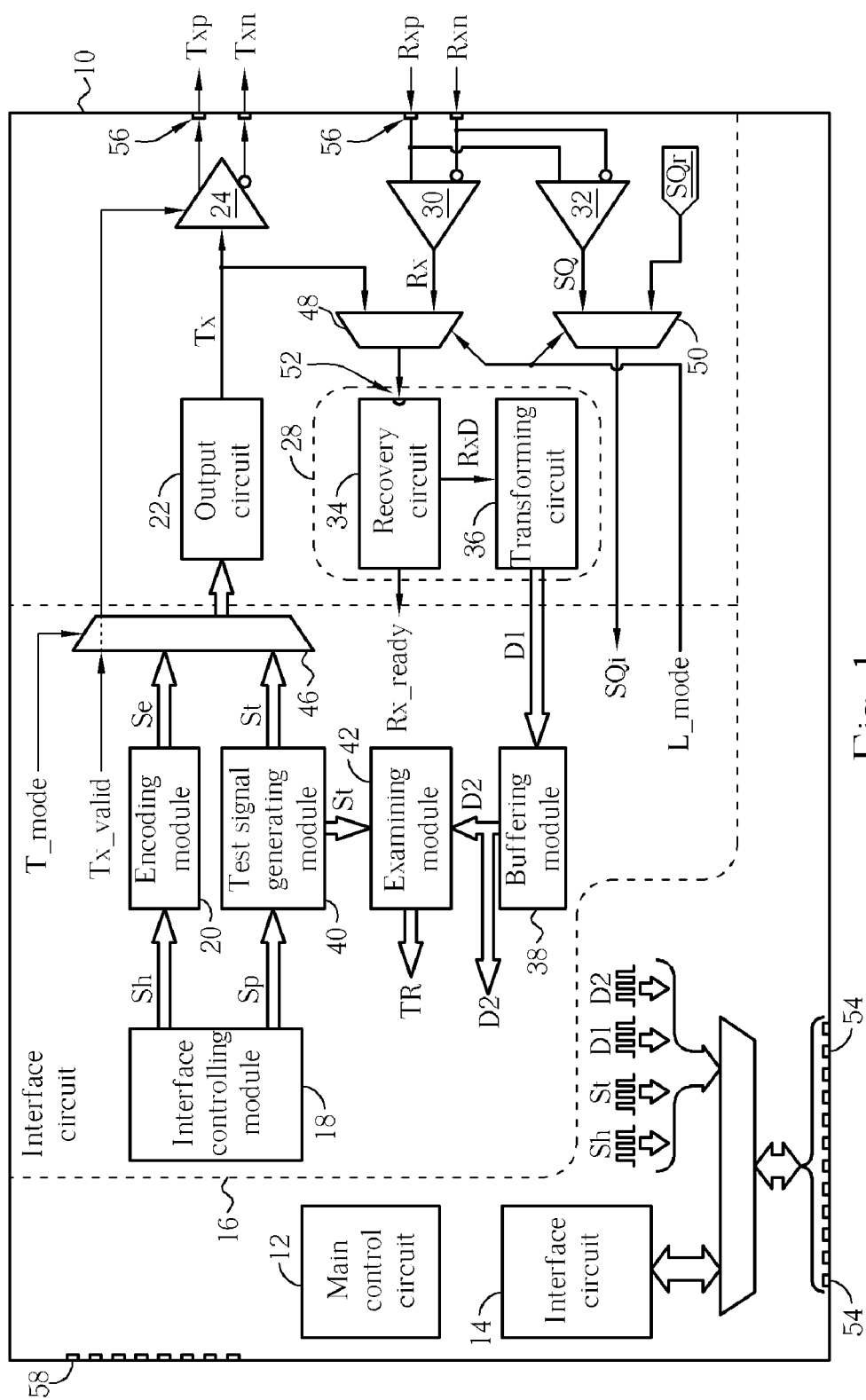
FIG. 1 is a diagram of a SATA interface of a chip according to the present invention.

Please refer to FIG. 1, which is a diagram of a SATA interface of a chip according to the present invention. The chip 10 shown in FIG. 1 can be a chipset. The chipset 10 comprises a main control circuit 12 and a plurality of interface circuits. In FIG. 1, only two interface circuits 14 and 16 are shown for simple illustration purposes. The above-mentioned main control circuit 12 is utilized to control the whole function of the chip 10, and each interface circuit 14 and 16 is utilized to support an interface of a specific standard. For example, the interface circuit 14 can support an IDE interface such that the chip 10 can connect and manage peripheral IDE devices through the interface circuit 14. Furthermore, in this embodiment, the chip 10 can also connect related test signals to the interfaces of smart electronic devices. The interface circuit 16 can be an SATA interface. The chip 10 can connect and manage peripheral SATA devices through the interface circuit 16. The main control circuit 12 can integrate the data exchange among these different interfaces, CPU, and memories. As shown in FIG. 1, the chip 10 can comprise a plurality of I/O pads 54, 56, and 58. These I/O pads 54, 56, and 58 are pins connected to outer circuits. The main control circuit 12, the interface circuit 14, and the interface circuit 16 can exchange data/signals with the outer circuits through each I/O pads 54, 56, and 58.

In order to accomplish the SATA interface, the interface circuit 16 can comprise an interface control module 18, an encoding module 20, an output circuit 22, a transmitter 24, a receiver 30, an input circuit 28, a buffering module 38, and a squelch preamplifier 32. The interface control module 18 is utilized to control the operations of the interface circuit 16. The encoding module 20 can be an 8-bit or 10-bit encoding module, which can receive an 8-bit signal Sh from an 8-bit bus, transform the signal Sh into a 10-bit encoded signal Se, and output through a 10-bit bus. The output circuit 22 can be a parallel-to-serial circuit, which can receive the 10-bit signal from the 10-bit bus and transform the 10-bit signal into an output signal Tx. The transmitter 24 can be a differential amplifier for transforming/driving the output signal Tx into a pair of differential signals Txp and Txn, which can be outputted outside the chip through the I/O pads 56. In addition, the transmitter 24 can be controlled by an enable signal Tx_valid such that the transmitter 24 is enabled or disabled. The receiver 30 can be a differential receiver. Therefore, a pair of differential signals Rxp and Rxn transferred from the outside can be detected by the receiver 30, such that the receiver 30 can generate corresponding receiving signals Rx. Moreover, the input circuit 28 can comprise a recovery circuit 34 and a transforming circuit 36. The recovery circuit 34 can be a data/clock recovery circuit, which comprises an input port 52. The recovery circuit 34 can receive a serial signal (such as the signal Rx) through the input port, and analyze the serial signal to find a data signal RxD and corresponding clocks carried by the serial signal. After smoothly locking a predetermined base-band clock, a ready signal Rx_ready can be transferred. The transforming circuit 36 can transform each bit of the stream of the data signal RxD into a 10-bit parallel signal D1 (that is an inversed transformation of the output circuit 22) and output the 10-bit parallel signal D1 to the buffering module 38. The buffering module 38 can perform an elastic buffering operation and a word aligning operation on the signal D1. Moreover, the squelch preamplifier 32 can detect whether there is a common mode signal between the pair of differential signals Rxp and Rxn, and generate a squelch signal SQ as a notifying signal SQi shown in FIG. 1 in order to represent whether the receiver 30 receives a pair of differential signals or not.

When the interface circuit 16 is utilized to implement the SATA interface and utilized to manage the SATA peripheral devices, the commands/data to be transferred to the peripheral devices are firstly encoded by the encoding module 20 such that the 8-bit commands/data are encoded into a 10-bit encoded signal. Then, the digital output circuit 22 transforms the 10-bit encoded signal into a serial output signal Tx. In addition, the analog transmitter 24 drives the serial output signal Tx such that the serial output signal Tx is transformed into a pair of differential signals Txp and Txn, and outputs the pair of differential signals Txp and Txn to the peripheral devices. The peripheral devices transfer a pair of differential signals Rxp and Rxn to the interface circuit 16. First, the receiver 30 detects/receives the pair of differential signals Rxp and Rxn as a serial signal Rx. At the same time, the squelch preamplifier 32 generates a corresponding squelch signal SQ as a notifying signal SQi. The notifying signal SQi represents that the bus between the interface circuit and the peripheral devices has been toggled such that the interface circuit 16 can receive the outer signals, and the input circuit 28 and the buffering circuit 38 start to process the input signal of the input ports 52. Furthermore, the digital input circuit 28 can analyze the signal Rx to extract the serial data and clocks carried by the signal Rx, and transform the serial data into the 10-bit parallel signal D1. After the buffering operation of the buffering module 38, the signal D2 can be formed, and the signal D2 can be read by the interface controlling module 18. Therefore, the output circuit 22, the transmitter 24, the receiver 30 (the squelch preamplifier 32), and the input circuit 28 can act as the analog front end (AFE) of the interface circuit 16.

In order to accomplish the present invention test technique in the interface circuit 16, the present invention embeds a multiplexer 48 inside the interface circuit 16. The multiplexer 48 can receive a control signal L_mode, and can be controlled by the control signal L_mode in order to selectively transfer the output signal Tx of the output circuit 22 or the received signal Rx of the receiver 30 to the I/O ports 52 of the input circuit 28. When the multiplexer 48 selects to directly transfer the output signal Tx to the I/O ports of the input circuit 28, a test circuit, an inner loop-back circuit, is formed. In co-ordination with the testing operations of the inner loop-back circuit, the interface circuit 16 further comprises a test signal generating module 40, a switching module 46, an examining module 42, and another multiplexer 50. Please note that the test signal generating module can be controlled by a test pattern signal Sp to generate a 10-bit parallel test signal St having a predetermined pattern. For example, the test pattern signal Sp can be a 4-bit signal. When the test pattern signal Sp corresponds to a first predetermined value, the test signal St can be generated to have a corresponding pattern. When the test pattern signal Sp corresponds to a second predetermined value, the test signal St can be generated to have another pattern corresponding to the second predetermined value. In other words, the pattern to be generated is controlled according to the content of the test pattern signal Sp. The switching module 46 is controlled by another control signal T_mode to selectively transfer the encoded signal Se or the test signal St to the output circuit 22 according to the control signal T_mode. The examining module 42 can compare the test signal St with the signal D2, and generate a corresponding examining result TR. Furthermore, the multiplexer 50 and the multiplexer 48 are similarly controlled by the control signal L_mode such that the multiplexer 50 and the multiplexer 48 can selectively utilize another predetermined reference signal SQr to replace the squelch signal SQ generated by the squelch preamplifier 32 such that the reference signal SQr is now utilized as the notifying signal SQi.

Figure 2:
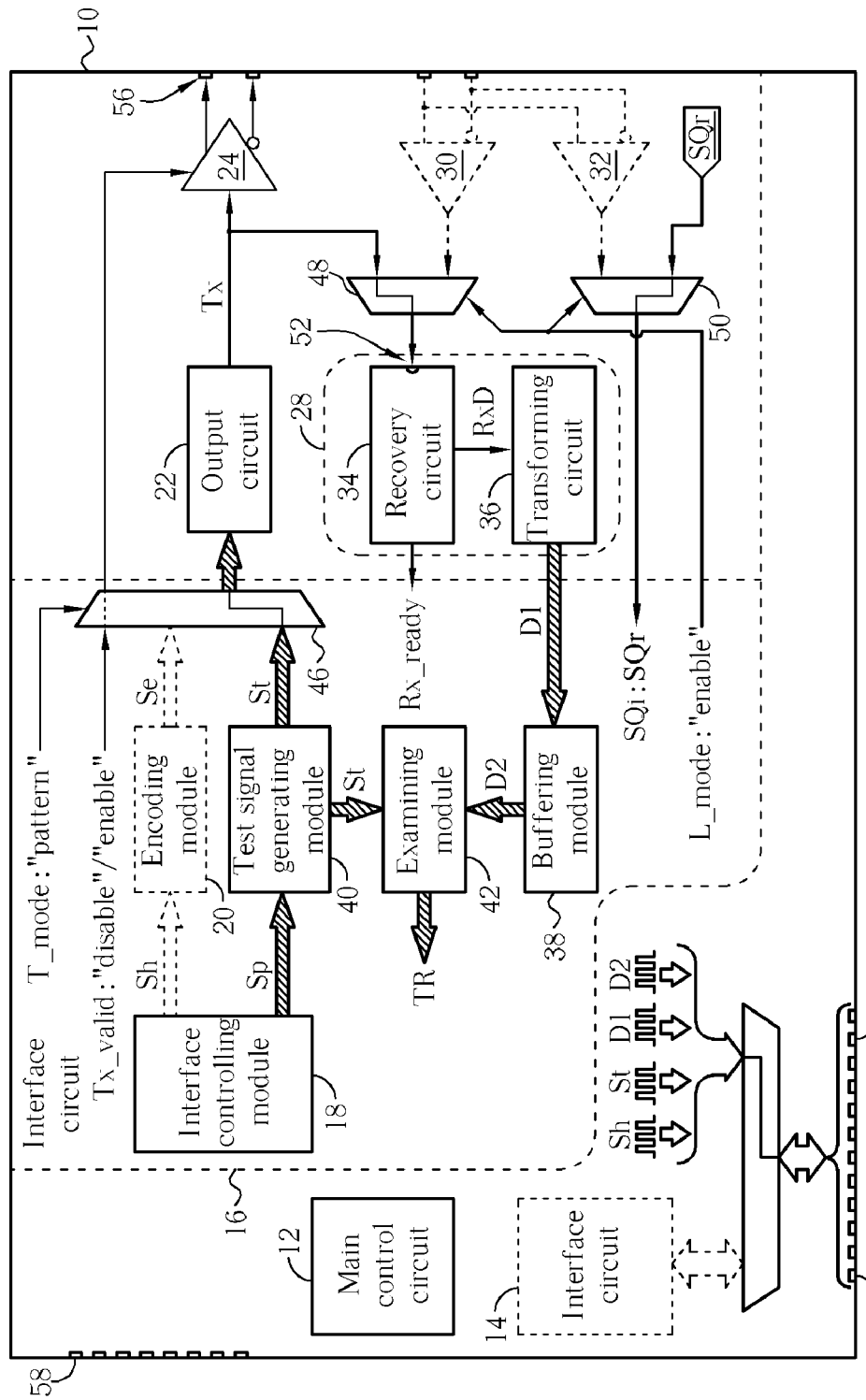
FIG. 2 is a diagram illustrating the chip shown in FIG. 1 performing an inner loop-back test on the interface circuit.

Please refer to FIG. 2 (in conjunction with FIG. 1). FIG. 2 is a diagram illustrating the chip 10 shown in FIG. 1 performing an inner loop-back test on the interface circuit 16. When the chip 10 is operated in the above-mentioned test mode, the present invention can control the test signal generating module 40 through using the test pattern signal Sp, and utilize the switching module 46 to use the test signal St to replace the encoded signal Se. In addition, the test signal St is transformed into the output signal Tx by the output circuit 22. At the same time, the transmitter 24 can be controlled by the enabling signal Tx_valid such that the transmitter 24 is disabled. The multiplexer 48 can be controlled by the control signal L_mode such that the multiplexer 48 can utilize the output signal Tx to replace the received signal Rx. Therefore, the output signal Tx is directly utilized as the output of the input circuit 28. The above-mentioned look back circuit is formed. The data flows from the output circuit 22 to the input circuit 28, but the analog receiver 30/transmitter 24 are no longer utilized (in other words, the receiver 30 can stop operating or stop receiving/detecting signals). The output signal Tx, generated according to the test signal St, is transformed into the corresponding signal D2 through being processed by the recovery circuit 34, the transforming circuit 36, and the buffering module 38. Then, the examining module 42 compares the signal D2 with the original test signal St in order to validate whether the inner loop-back circuit (that is, the output circuit 22—the input circuit 28—the buffering module 38) works correctly. In other words, the examining module 42 can know a predetermined signal (the theoretical signal) according to the original test signal St. Therefore, the examining module 42 can compare the actual signal, generated by the inner loop-back circuit, with the predetermined signal to validate whether the inner loop-back operates correctly. In addition, the examining module 42 can output the compared result as the examining result TR.

When the multiplexer 48 is switched to form the inner loop back circuit, the present invention multiplexer 50 is also switched to utilize the reference signal SQr as the notifying signal SQi such that the input circuit 28, the buffering module 38, and other circuits can correctly utilize the output signal Tx as an input of the input circuit 28. In the inner loop back mode, the receiver 30 and the squelch preamplifier 32 do not receive signals, so the squelch preamplifier 32 does not generate a correct squelch signal. As mentioned previously, the interface circuit 16 has to be triggered according to the notifying signal such that the interface circuit 16 is able to make the input circuit 28 and buffering module start operating. In order to make the inner loop back test work correctly, the present invention utilizes the reference signal SQr as the notifying signal SQi such that the interface circuit 16 can utilize the output signal Tx as the input received by the input circuit 28 and process the output signal Tx correctly.

In a preferred embodiment of the present invention, the examining result TR generated by the examining module 42 can be temporarily stored in a register of the chip 10. Therefore, testing engineers of the chip 10 can access the examining result through other I/O pads (for example, the I/O pads 58). As known by those skilled in the art, the chip 10, which is utilized as a chipset, comprises multiple registers. The values stored in these registers can be utilized to represent the operation state and parameters of the chipset. Furthermore, the values stored in the registers can be utilized as a communication medium between the chipset and other outer circuits. For example, in a normal operation, a certain register of the chipset can be connected to a CPU (or another peripheral device). Therefore, the value stored in the certain register can be utilized to inform the operation state of the chip to the CPU (the peripheral device.) When the chip test is performed as shown in FIG. 2, the chip 10 is not connected to the CPU and the peripheral device. At this time, the testing engineers can make the examining module 42 store the examining result TR inside the registers embedded inside the chip, and utilize the corresponding I/O pads to access the examining result in order to know the operation state of the inner loop back circuit. Similarly, when the chip test is performed, the operation state of each circuit in the inner loop back circuit can be outputted through the I/O pads of other interface circuits. For example, as shown in FIG. 1, when the chip 10 is utilized as a chipset, the I/O pads 54 are I/O pins, utilized by another interface circuit 14. When the chip test is performed as shown in FIG. 2 in order to validate the inner loop back circuit of the interface circuit 16, however, the interface circuit 14 does not need to operate. The operation result (such as the test signal St, the signals D1 and D2) of each circuit of the interface circuit 16 can be outputted through the I/O pads 54 of the interface circuit 14 such that the testing engineers can utilize these signals to validate the operations of each circuit. For example, through comparing the signal D1 with D2, the operation of the buffering module 38 can be validated to detect whether the buffering module 38 operates normally. Moreover, the test signals L_mode and T_mode (in addition, the enabling signal Tx_valid), utilized to set the modes in the test operation, can be set through using the registers inside the chip 10. Alternatively, these specific I/O pads can be set up on the chip 10 for these control signals such that the testing engineers can set the two signals from outside in order to control the test operation. Furthermore, in the embodiment shown in FIG. 2, the enabling signal Tx_Valid can enable the transmitter 24. Therefore, the output signal Tx not only can be transferred back to the input circuit 28, but also can be transferred to the outer circuit through the transmitter such that the testing engineers can determine whether the input signal Tx is normal.

Figure 3:
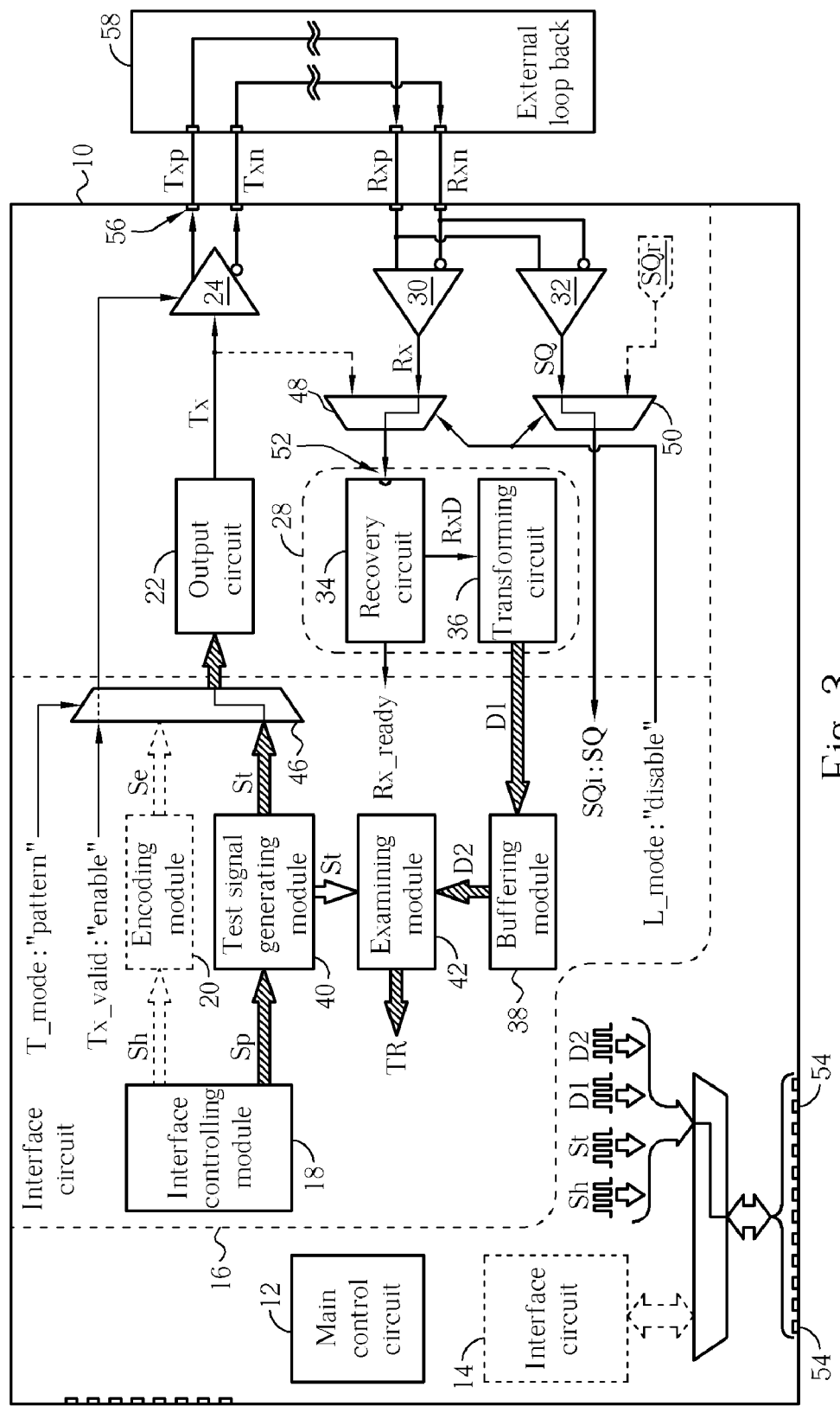
FIG. 3 is a diagram illustrating the chip shown in FIG. 1 performing an outer loop-back test on the interface circuit.

The present invention can utilize the inner loop back test result and other tests to perform a cross-comparison to determine the operations of each circuit. Following the embodiments shown in FIG. 1 and FIG. 2, please refer to FIG. 3. FIG. 3 is a diagram illustrating the chip 10 shown in FIG. 1 performing an outer loop-back test on the interface circuit 16. The outer loop back circuit 58 can be connected to the I/O pads of the chip 10 for transferring the signal, outputted by the transmitter 24, back to the receiver 30. Comparing FIG. 2 with FIG. 3, when the outer loop-back test is performed, the enabling signal Tx_valid can be changed such that the transmitter 24 can be enabled to start operating. The control signal T_mode makes the test signal St generated by the test signal generating module 40 become the input signal Tx. Then, the input signal Tx is outputted as a pair of differential signals Txp and Txn by the transmitter 24. The pair of differential signals Txp and Txn becomes the pair of differential signals Rxp and Rxn because of the external loop back circuit 58. The pair of differential signals Rxp and Rxn is transferred back into the chip 10 such that the receiver 30 can provide the corresponding received signal Rx according to the two signals Rxp and Rxn. At the same time, the control signal L_mode is also changed to cut off the inner loop back circuit in order to transfer the received signal Rx into the input circuit 28. The squelch signal SQ, generated by squelch preamplifier 32 according to the signals Rxn and Rxp, is regarded as the notifying signal SQi. Therefore, the input circuit 28 and the buffering module 38 can perform corresponding operations. After corresponding signals D1 and D2 are generated according to the received signal Rx, the examining module 42 can compare the signal D2 with an original input signal St such that operation of the outer loop back circuit can be validated. Please refer to FIG. 2 and FIG. 3 again. In the inner loop back test, the signal flow route only includes the output circuit 22, the input circuit 28, and the buffering module 38. In the outer loop back test, the signal flow route includes the output circuit 22, the transmitter 24, the receiver 30, the input circuit 28, and the buffering module 38. Furthermore, through comparing the inner loop back test result and the outer loop back test result, the cross-comparison is performed such that the operation state of each circuit of the AFE can be determined. For example, if the inner loop back test is normal, the outer loop back test has an error. This represents that the transmitter 24 or the receiver 30 may have some problems. Similarly, when the outer loop back test shown in FIG. 3 is performed, signals (such as the signals D1 and D2) generated by a single circuit can also be outputted through the I/O pads 54 of the interface circuit 14 such that the testing engineers can utilize these signals to further ensure the operation of each circuit. Furthermore, a related measuring circuit can be installed in the external loop back circuit 58 in order to measure the signal characteristic (such as the jitter or time domain response) of the signals Txp and Txn.

Figure 4:
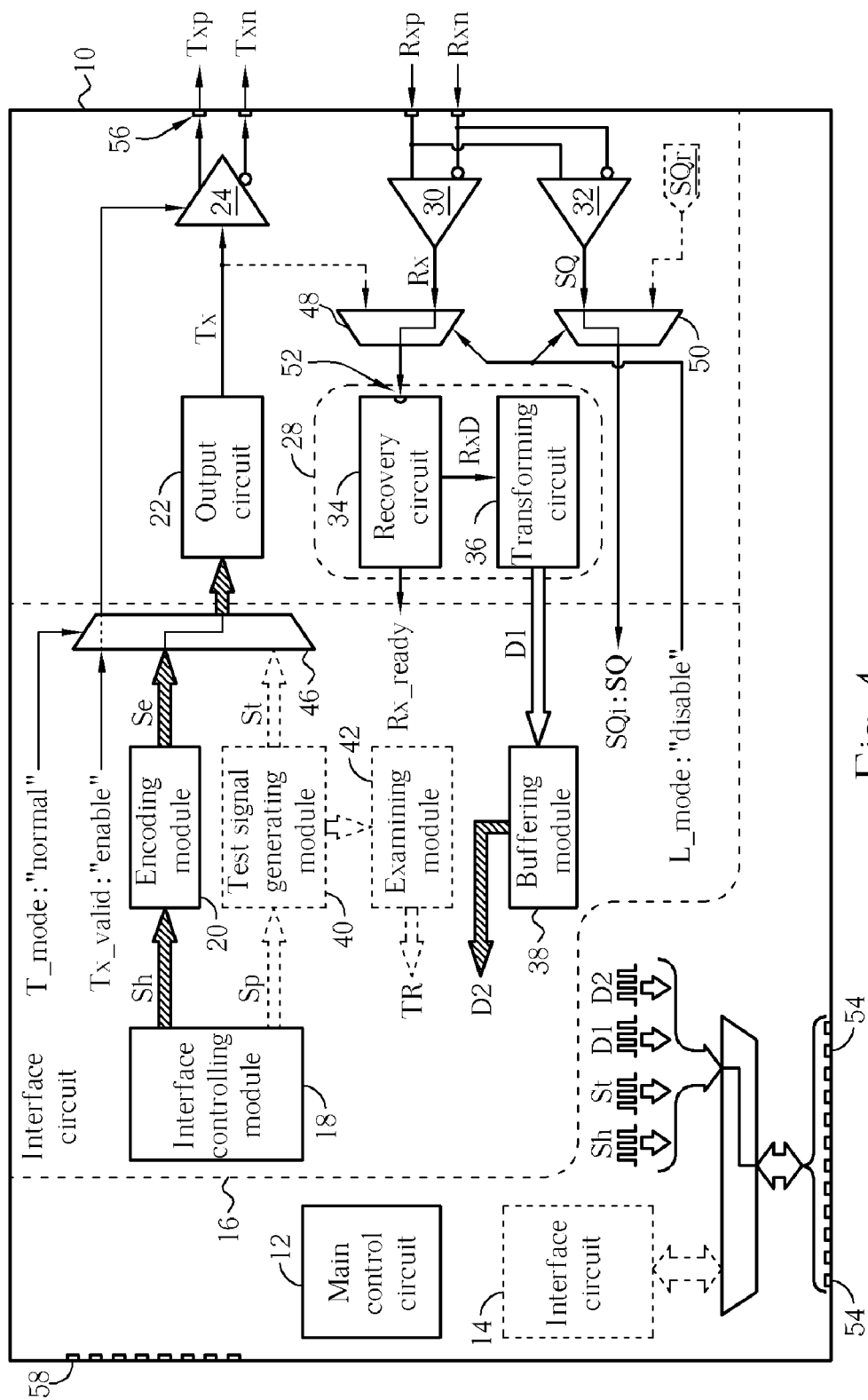
FIG. 4 is a diagram of the above-mentioned test of the chip.

Following the embodiments shown in FIG. 2 and FIG. 3, please refer to FIG. 4. As mentioned previously, the most basic test technique is to test the whole function of the chip. That is, the chip performs a predetermined operation, and the output result of the chip is detected to see whether the result is correct. FIG. 4 is a diagram of the above-mentioned test of the chip 10. Compared with FIG. 3, in FIG. 4, the interface controlling module 18 actually inputs the signal Sh into the encoding module 20. Therefore, the encoding module 20 can encode the signal Sh into the encoded signal Se. Furthermore, the encoded signal Se can be transferred to the output circuit 22 to generate a corresponding output signal Tx through switching the control signal T_mode. The transmitter 24 can receive the signal Tx and transform the signal Tx into a pair of differential signals Txp and Txn such that the pair of differential signals Txp and Txn can be detected to see whether the pair of differential signals Txp and Txn is correct. Similar to the embodiments shown in FIG. 2 and FIG. 3, when the test shown in FIG. 4 is performed, the input/output signal of each circuit can be outputted through the I/O pads 54. For example, the testing engineers can output the original signal Sh in order to compare the signal Sh with the final output signal to detect whether they are correct. Through cross-comparison of the test results of the tests shown in FIG. 2–FIG. 4, the operation of each circuit can be known. For example, if the output of the chip 10 does not comply with the predetermined output when the tests shown in FIG. 3 or FIG. 4 are utilized, but the inner loop back test shown in FIG. 2 is normal, it is possible that the analog transmitter 24 cannot operate normally. A similar situation may occur where we can ensure that the output circuit 22 and the transmitter 24 can operate normally when the tests shown in FIG. 2 and FIG. 3 are performed, but the signals Txp and Txn have some problem when the test shown in FIG. 4 is performed. This represents that the encoding module 20 may not operate normally.

Figure 5:
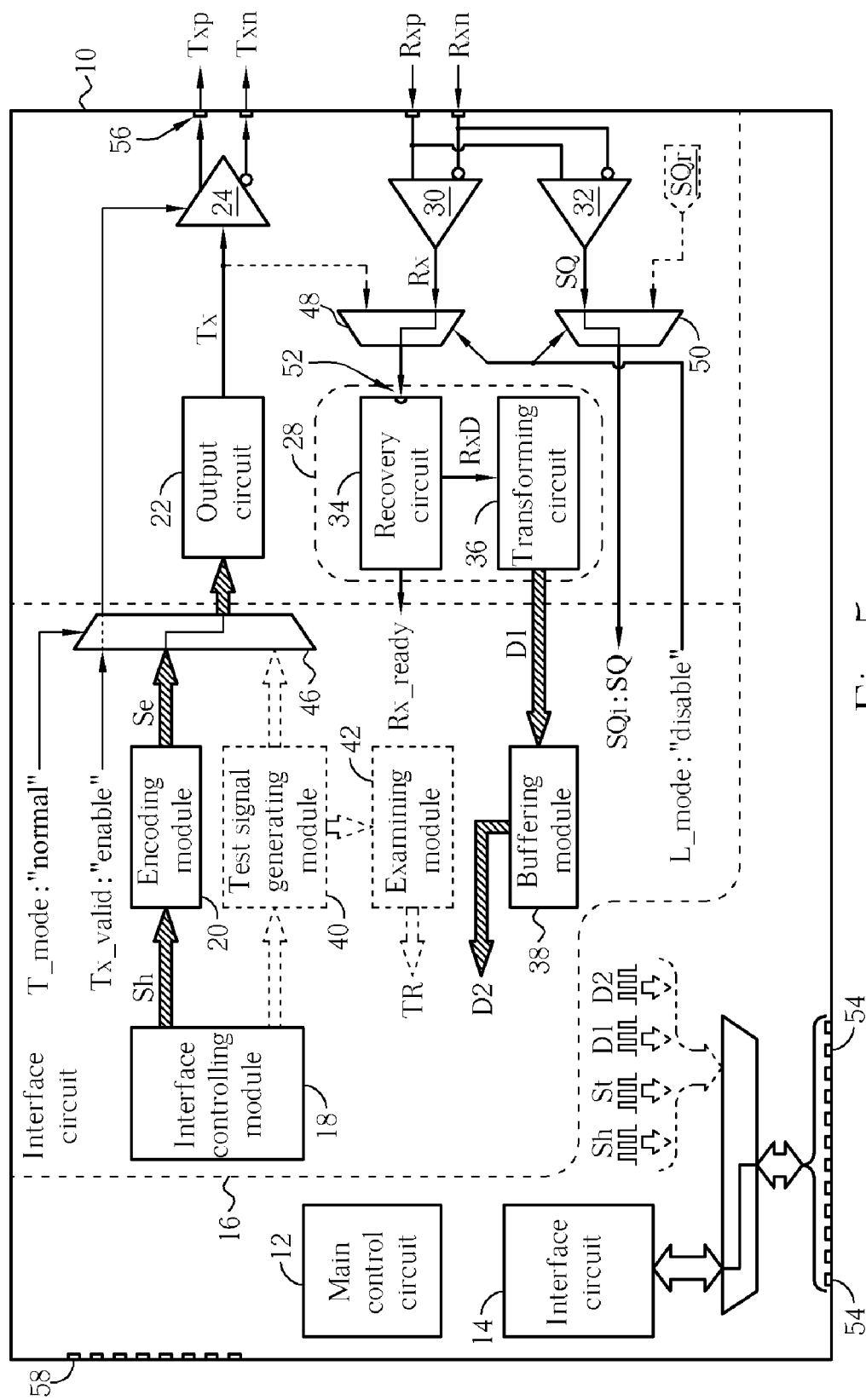
FIG. 5 is a diagram illustrating the chip operating in a normal mode and achieving the chipset function.

Following the embodiment shown in FIG. 1, please refer to FIG. 5. FIG. 5 is a diagram illustrating the chip 10 operating in a normal mode and achieving the chipset function. The control signals T_mode and L_mode isolate the related testing circuits and loop back circuits such that the interface circuit 16 can operate normally. Therefore, the SATA interface can be achieved. Furthermore, each I/O pad 54 can be normally utilized by the interface circuit 14.

To sum up, in contrast to the prior art testing technique, the present invention can embed the inner loop back circuit inside the chip. The inner loop back circuit can selectively isolate some circuits of the chip when the chip test is performed. Therefore, the testing engineers can determine defective parts of the chip more quickly and accurately. In other words, the testing/debugging of the chip can be more efficient. This can raise the yield of the chip, and further reduce the cost of producing/designing the chip. From FIG. 1 to FIG. 5, the present invention utilizes a chipset as an embodiment for illustrating the testing technique. In the actual implementation, however, the present invention can be utilized in all kinds of chips such that the chip test can be performed more efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip capable of performing self testing, comprising:
   an output circuit for generating output signals;
   a transmitting circuit coupled to the output circuit for transmitting output signals generated by the output circuit;
   a receiving circuit for receiving signals transmitted to the chip and generating corresponding receiving signals;
   a first multiplexer having:
      a first input port coupled to the output circuit for receiving output signals generated by the output circuit; and
      a second input port coupled to the receiving circuit for receiving signals generated by the receiving circuit; and
   an input circuit comprising a recovery circuit coupled to an output port of the first multiplexer for receiving outputs of the first multiplexer and generating pulses and data signals according to outputs of the first multiplexer.

2. The chip of claim 1 wherein when the chip operates in a normal mode, the first multiplexer is capable of outputting receiving signals generated by the receiving circuit; and when the chip operates in a test mode, the first multiplexer is capable of outputting output signals generated by the output circuit, and the receiving circuit is capable of terminating receiving signals transmitted to the chip.

3. The chip of claim 1 further comprising:
  an encoding module for encoding internal signals generated by the chip;
  a test signal generation module for generating test signals; and
  a second multiplexer having:
    a first input port coupled to the encoding module;
    a second input port coupled to the test signal generation module; and
    an output port coupled to the output circuit for outputting encoded signals generated by the encoding module or test signals generated by the test signal generation module.

4. The chip of claim 3 further comprising a check module coupled to the test signal generation module and the input circuit for checking if test signals generated by the test signal generation module are consistent with signals generated by the input circuit.

5. The chip of claim 4 further comprising a buffer module coupled between the check module and the input circuit for elastic buffering and aligning signals generated by the input circuit.

6. The chip of claim 3 wherein the encoding module is capable of encoding an 8-bit signal into a 10-bit signal.

7. The chip of claim 1 wherein the output circuit is a parallel-to-serial circuit capable of sequentially outputting bits received at the same time.

8. The chip of claim 1 wherein the transmitting circuit is a differential amplifier for converting output signals generated by the output circuit into pairs of differential signals.

9. The chip of claim 1 wherein the input circuit further comprises a serial-to-parallel circuit coupled to the recovery circuit for converting data signals generated by the recovery circuit.

10. The chip of claim 1 being a chipset wherein the output circuit, the transmitting circuit, the receiving circuit, and the input circuit are part of an analogue front end (AFE) conforming to serial advanced technology attachment (SATA).

11. A method for testing a chip comprising the following steps:
  (a) generating test signals;
  (b) providing an output circuit for generating output signals according to the test signals;
  (c) controlling a multiplexer to input the output signals generated by the output circuit to an input circuit; and
  (d) comparing the test signals with pulses and data signals generated by a recovery circuit of the input circuit according to the output signals and generating a corresponding result.

12. The method of claim 11 further comprising generating a reference indication signal to indicate to the input circuit that the received output signals are differential signals.

13. The method of claim 11 further comprising:
  (e) generating test signals;
  (f) utilizing the output circuit for generating output signals according to the test signals generated in step (e);
  (g) transmitting the output signals generated by the output circuit in step (f);
  (h) providing a receiving circuit for receiving signals transmitted to the chip;
  (i) controlling the multiplexer to input receiving signals generated by the receiving circuit correspondingly to the input circuit; and
  (j) comparing the test signals generated in step (e) with signals generated by the input circuit according to the receiving signals and generating a corresponding result.

14. A chip capable of performing self testing, comprising:
  an output circuit for generating output signals;
  a transmitting circuit coupled to the output circuit for transmitting output signals generated by the output circuit;
  a differential receiver for receiving signals transmitted to the chip and generating corresponding receiving signals;
  a squelch pre-amplifier coupled to input ports of the differential receiver for generating squelch indication signals according to signals transmitted to the chip;
  a first multiplexer having:
    a first input port coupled to the output circuit for receiving output signals generated by the output circuit; and
    a second input port coupled to the differential receiver for receiving signals generated by the differential receiver, and
  an input circuit coupled to an output port of the first multiplexer for receiving outputs of the first multiplexer.

15. The chip of claim 14 further comprising a third multiplexer for outputting squelch indication signals generated by the squelch pre-amplifier or reference indication signals.

* * * * *